(12) United States Patent
Tsuchiya et al.

(10) Patent No.: US 7,533,456 B2
(45) Date of Patent: May 19, 2009

(54) FABRICATION PROCESS FOR MAGNETO-RESISTIVE EFFECT DEVICES OF THE CPP STRUCTURE

(75) Inventors: Yoshihiro Tsuchiya, Tokyo (JP); Tomohito Mizuno, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/757,174

(22) Filed: Jun. 1, 2007

(65) Prior Publication Data
US 2008/0052896 A1 Mar. 6, 2008

(30) Foreign Application Priority Data
Aug. 30, 2006 (JP) ................................ 2006-233247

(51) Int. Cl.
G11B 5/127 (2006.01)
H04R 31/00 (2006.01)

(52) U.S. Cl. ............... 29/603.14; 29/603.11; 29/603.13; 29/603.15; 29/603.16; 29/603.18; 360/324.11; 427/127; 427/128; 451/5; 451/41; 204/192.15

(58) Field of Classification Search ............... 29/603.11, 29/603.13–603.16, 603.18; 360/324.12; 427/127, 128; 451/5, 41
See application file for complete search history.

(56) References Cited

U.S. PATENT DOCUMENTS

2005/0074634 A1 4/2005 Hasegawa et al.
2007/0297103 A1* 12/2007 Zhang et al. ........... 360/324.12
2008/0052896 A1 3/2008 Tsuchiya et al.

FOREIGN PATENT DOCUMENTS

| EP | 1318208 | 6/2003 |
|----|---------|--------|
| JP | 2004-146480 | 5/2004 |
| JP | 2005-51251 | 2/2005 |
| JP | 2005-116701 | 4/2005 |

OTHER PUBLICATIONS

U.S. Appl. No. 11/968,911, filed Jan. 3, 2008, Tsuchiya et al.

(Continued)

Primary Examiner—Paul D Kim
(74) Attorney, Agent, or Firm—Oblon, Spivak, McClelland, Maier & Neustadt, P.C.

(57) ABSTRACT

A free layer functions such that a magnetization direction changes depending on an external magnetic field, and is made up of a multilayer structure including a first Heusler alloy layer, and a fixed magnetization layer takes a form wherein an inner pin layer and an outer pin layer are stacked one upon another with a nonmagnetic intermediated layer sandwiched between them. The inner pin layer is made up of a multilayer structure including a second Heusler alloy layer. The first and second Heusler alloy layers are each formed by a co-sputtering technique using a split target split into at least two sub-targets in such a way as to constitute a Heusler alloy layer composition. When the Heusler alloy layer is formed, therefore, it is possible to bring up a film-deposition rate, improve productivity, and improve the performance of the device.

15 Claims, 10 Drawing Sheets

OTHER PUBLICATIONS

U.S. Appl. No. 11/757,174, filed Jun. 1, 2007, Tsuchiya et al.
U.S. Appl. No. 11/762,457, filed Jun. 13, 2007, Mizuno et al.
U.S. Appl. No. 11/768,435, filed Jun. 26, 2007, Tsuchiya et al.
U.S. Appl. No. 11/626,562, filed Jan. 24, 2007, Hara et al.
U.S. Appl. No. 11/870,097, filed Oct. 10, 2007, Shimazawa et al.
U.S. Appl. No. 11/931,219, filed Oct. 31, 2007, Shimazawa et al.
U.S. Appl. No. 11/934,979, filed Nov. 5, 2007, Mizuno et al.
U.S. Appl. No. 12/128,352, filed May 28, 2008, Mizuno et al.

* cited by examiner

FABRICATION PROCESS FOR MAGNETO-RESISTIVE EFFECT DEVICES OF THE CPP STRUCTURE

BACKGROUND OF THE INVENTION

1. Field of the Invention

The present invention relates generally to a fabrication process for a magneto-resistive effect device of the CPP structure, and more particularly a fabrication process for a Heusler alloy layer that constitutes a part of the multilayer structure of that device.

2. Explanation of the Prior Art

With recent improvements in the plane recording density of hard disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinned layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinned layer (antiferromagnetic layer). In a preferable embodiment of the fixed magnetization layer, it is made up of a synthetic pinned layer with a non-magnetic intermediate layer sandwiched between an inner pin layer and an outer pin layer.

Incidentally, common GMR heads used so far in the art have a CIP (current in plane) structure wherein a current for detecting magnetic signals (the so-called sense current) is passed parallel with the plane of each of the layers forming the GMR device. On the other hand, GMR devices having the so-called CPP (current perpendicular to plane) structure wherein the sense current is passed perpendicularly (stacking direction) to the plane of each of the layers forming the GMR device, too, are now under development as next-generation ones. The aforesaid TMR devices, too, would come under the CPP structure category.

In the GMR devices proposed so far in the art, the free layer and fixed magnetization layer are still composed mainly of CoFe alloys, NiFe alloys or the like. Referring to such GMR devices of the CPP structure, even when they have a multilayer structure capable of achieving practical reproduction gap lengths, the magneto-resistivity change ratio (MR ratio)—the ratio of a magneto-resistivity change with respect to resistance—is barely about 4%, a figure still practically less than satisfactory. A possible reason why the MR ratio of conventional GMR devices of the CPP structure is small could be that the spin polarizability of CoFe or NiFe alloys used as the material for the free layer and fixed magnetization layers is small.

To increase the MR ratio of the GMR devices of the CPP structure, it has recently been proposed to use as the material for the free layer and fixed magnetization layer a Heusler alloy that is a sort of half-metal with its spin polarizability close to 1 (JP-A's 2005-51251 and 2005-116701).

Heusler alloy layers are generally formed by means of sputtering techniques.

However, inventors' studies have now revealed that for the reason that a Heusler alloy target has the nature of being so fragile that it can break up, sputtering at an increased input power offers a problem in that cracks appear in the target itself. It is thus still impossible to bring up the film-deposition rate, failing to boost productivity, and the ensuing film quality is far away from the expected level as well.

The situations being like this, the present invention has for its object to provide a Heusler alloy layer formation process by which the film-deposition rate can be brought up with improvements in productivity and device performance as well as a fabrication process for a magneto-resistive effect device of the CPP structure, by which productivity and device performance can be improved.

SUMMARY OF THE INVENTION

According to the invention, such an object is accomplished by the provision of a fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a first Heusler alloy layer; and said fixed magnetization layer takes on a form wherein an inner pin layer and an outer pin layer are stacked one upon another with a nonmagnetic intermediate layer sandwiched between them, wherein said inner pin layer is made up of a multilayer structure including a second Heusler alloy layer, and said first and second Heusler alloy layers are each formed by a co-sputtering technique using a split target split into at least two sub-targets in such a way as to constitute a Heusler alloy layer composition.

In a preferable embodiment of the invention, said first and second Heusler alloy layers are each a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and C.

In another preferable embodiment of the invention, said first and second Heusler alloy layers are each a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and an alloy of A and C.

In yet another embodiment of the invention, said general composition formula: $A_2BC$ gives $Co_2MnSi$, $Co_2MnGe$, and $Co_2FeSi$.

In a further preferable embodiment of the invention, said first and second Heusler alloy layers are each a Heusler alloy which has a general composition formula: ABC where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and C.

The present invention also provides a fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that its magnetization direction changes depending on an external magnetic field, and is made up of a multilayer structure including a Heusler alloy layer, wherein said Heusler alloy layer is formed by a co-sputtering technique using a split target split into at least two sub-targets in such a way as to constitute a Heusler alloy layer composition.

Further, the present invention provides a fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said fixed magnetization layer takes on a form wherein an inner pin layer and an outer pin layer are stacked one upon another with a nonmagnetic intermediate layer sandwiched between them, wherein said inner pin layer is made up of a multilayer structure including a Heusler alloy layer, and said Heusler alloy layer is formed by a co-sputtering technique using a split target split into at least two sub-targets in such a way as to constitute a Heusler alloy layer composition.

In a preferable embodiment of the invention, said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and C.

In another preferable embodiment of the invention, said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and an alloy of A and C.

In yet another preferable embodiment of the invention, said general composition formula: $A_2BC$ gives $Co_2MnSi$, $Co_2MnGe$, and $Co_2FeSi$.

In a further preferable embodiment of the invention, said Heusler alloy layer is a Heusler alloy which has a general composition formula: ABC where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and which is formed by a co-sputtering technique using a split target split into two sub-targets: an alloy of A and B, and C.

In a further preferable embodiment of the invention, the film-deposition rate for said co-sputtering technique is at least 0.2 Å/sec.

In the invention, when the Heusler alloy layer is formed, it is possible to increase the film-deposition rate, ending up with improved productivity and device performance.

DETAILED EXPLANATION OF THE INVENTION

The best mode for carrying out the invention is now explained in details.

Figure 1:
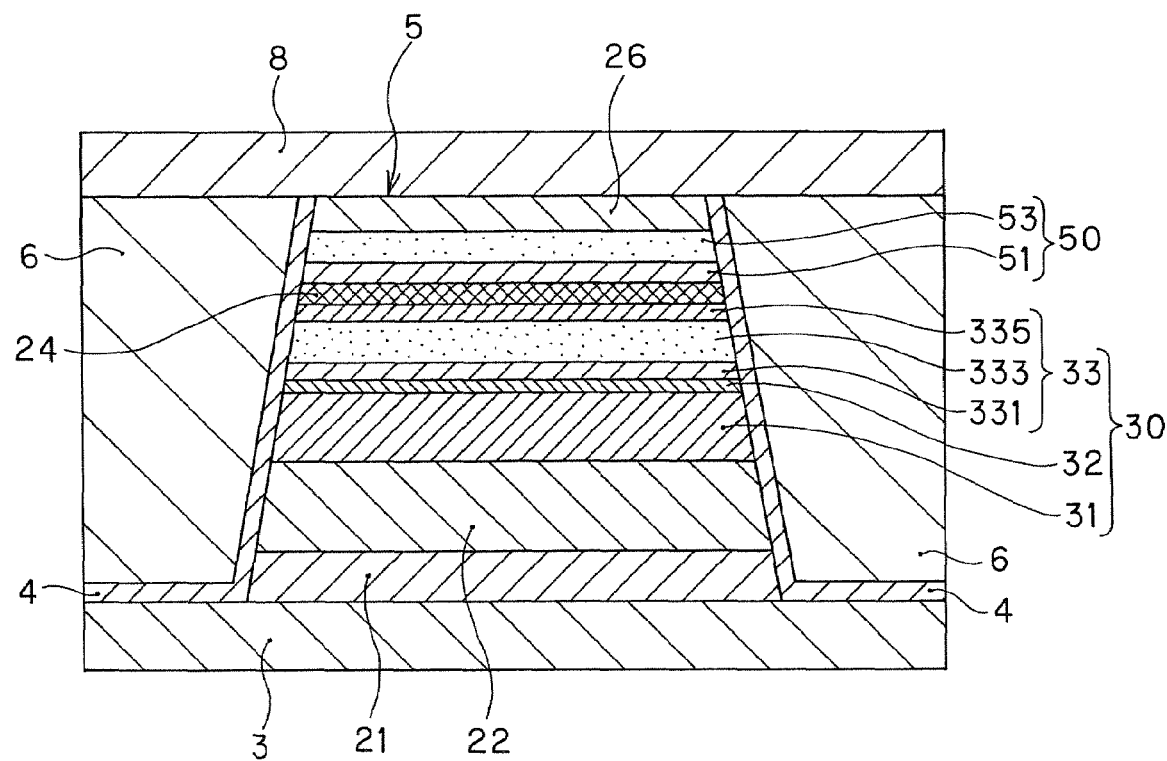
FIG. 1 is illustrative in schematic of the ABS (air bearing surface of a reproducing head in an embodiment of the invention in general, and the ABS of the magneto-resistive effect device of the CPP structure—part of the invention in particular.

FIG. 1 is illustrative of the ABS (air bearing surface) of a reproducing head in an embodiment of the invention in general; FIG. 1 is illustrative in schematic of the ABS of the magneto-resistive effect device having a CPP structure—part of the invention in particular. An ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC or the like (the protective layer adapted to cover the device), in a strict sense, positioned facing the medium opposite plane may be factored out, if necessary.

Figure 2:
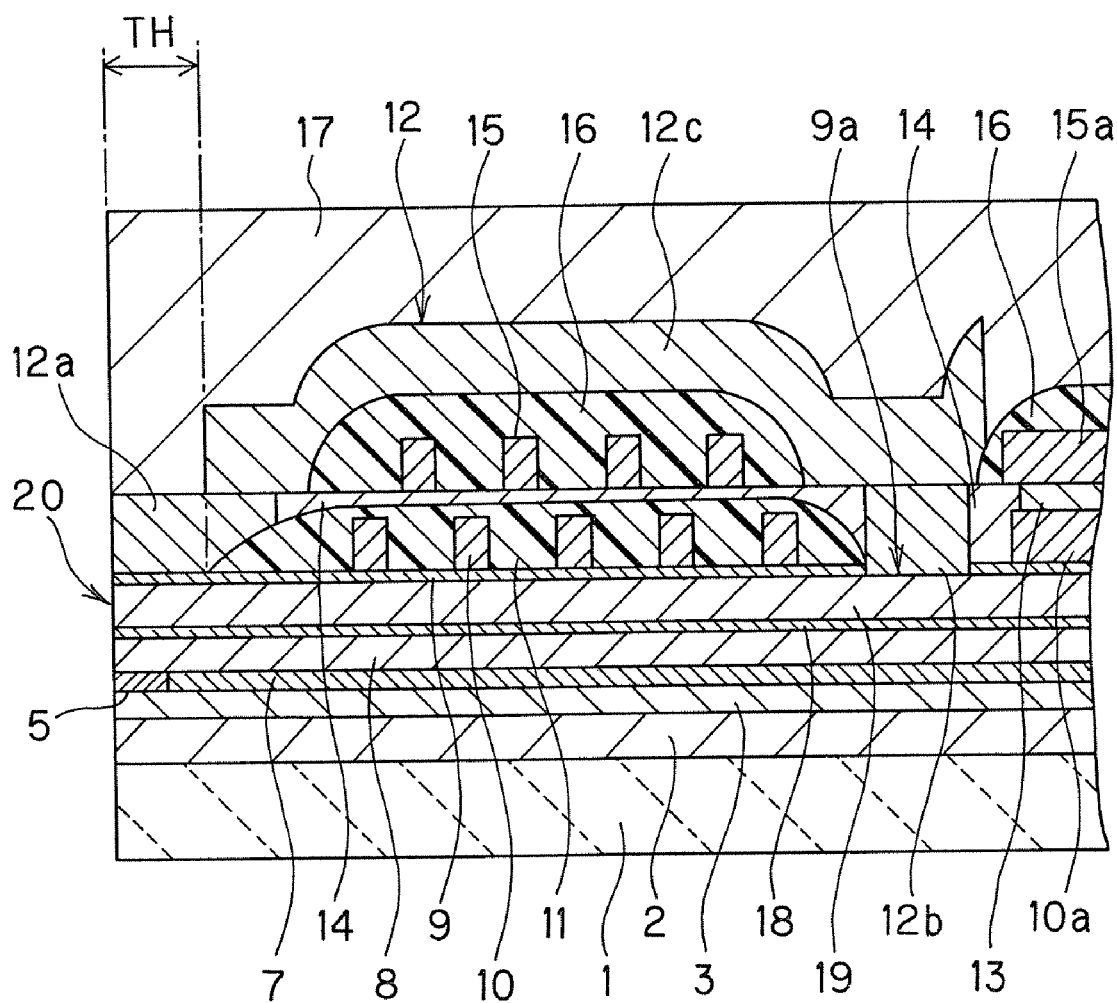
FIG. 2 is illustrative of the construction of a thin-film magnetic head according to one preferable embodiment of the invention; it is a sectional view illustrative of the ABS of the thin-film magnetic head and a section thereof vertical to a substrate.

FIG. 2 is illustrative of the construction of the thin-film magnetic head according to one preferable embodiment of the invention; it is a sectional view illustrative of a section of the thin-film magnetic head vertical to the ABS and substrate.

Figure 3:
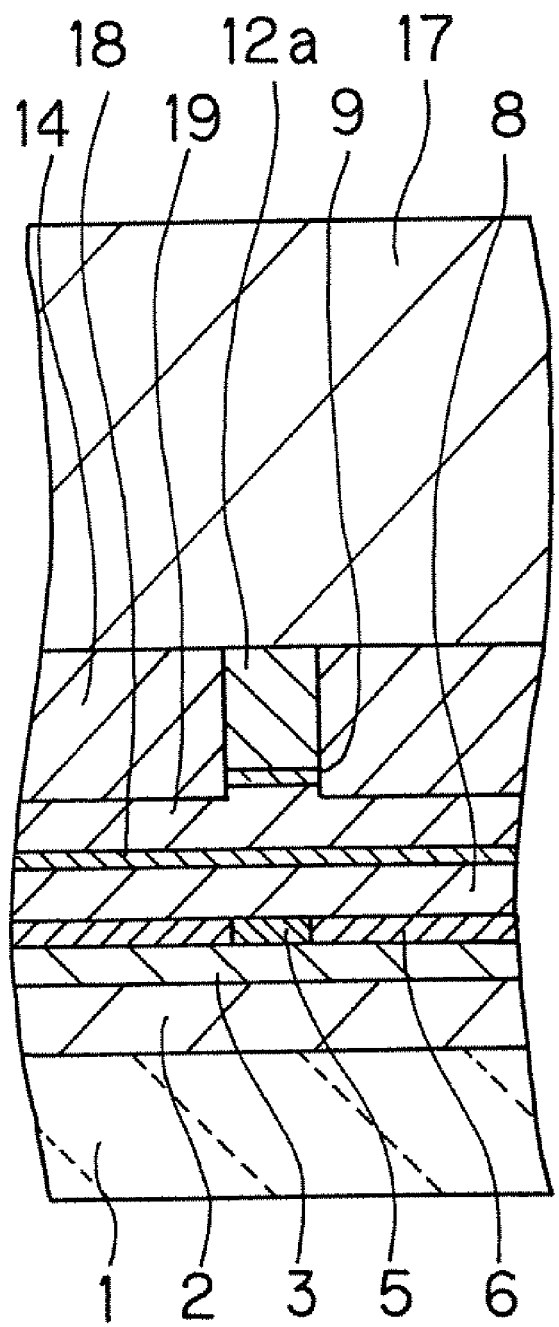
FIG. 3 is illustrative of the construction of the thin-film magnetic head according to one preferable embodiment of the invention; it is a sectional view illustrative of a section of a magnetic pole portion of the thin-film magnetic head parallel with the ABS in particular.

FIG. 3 is illustrative of the construction of the thin-film magnetic head according to one preferable embodiment of the invention in general; it is a sectional view illustrative of a section of a magnetic pole portion of the thin-film magnetic head parallel with the ABS in particular.

Figure 4:
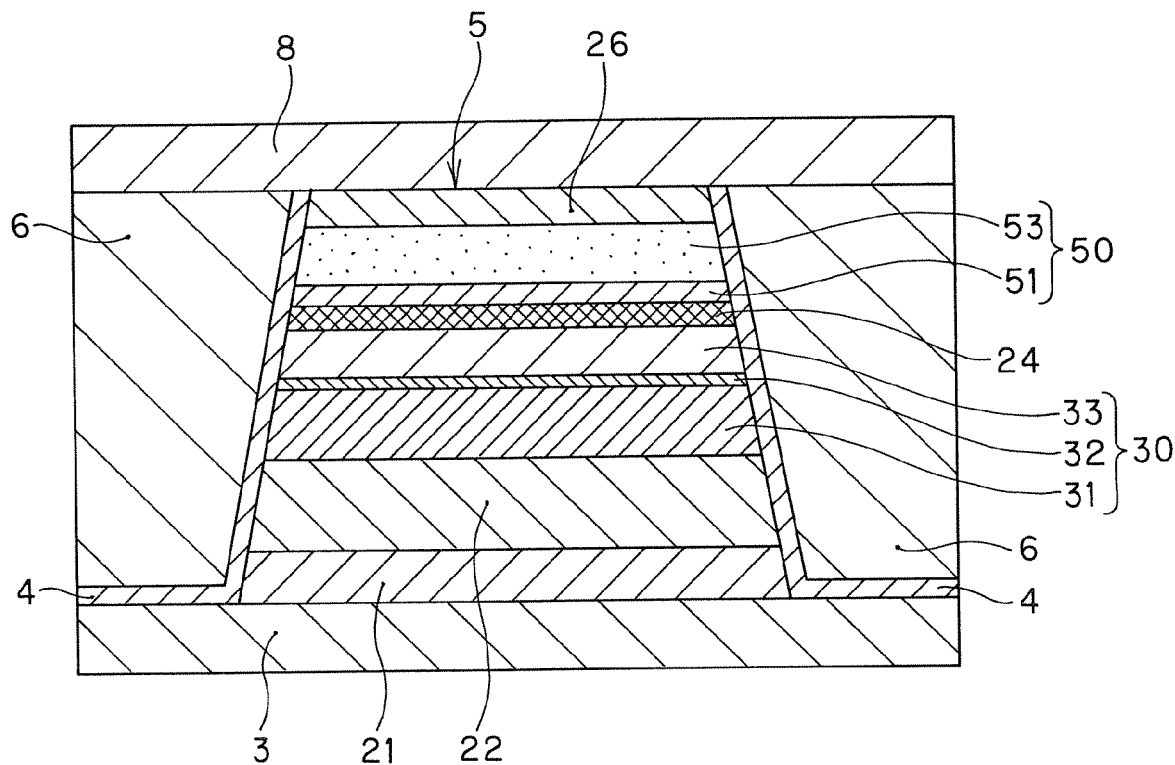
FIG. 4 is illustrative of a modification to FIG. 1; it is illustrative of a modification to the magneto-resistive effect device—part of the invention, as viewed from the ABS.

FIG. 4 is illustrative of a modification to FIG. 1; it is illustrative of a modified embodiment of the magneto-resistive effect device—part of the invention, as viewed from the ABS.

Figure 5:
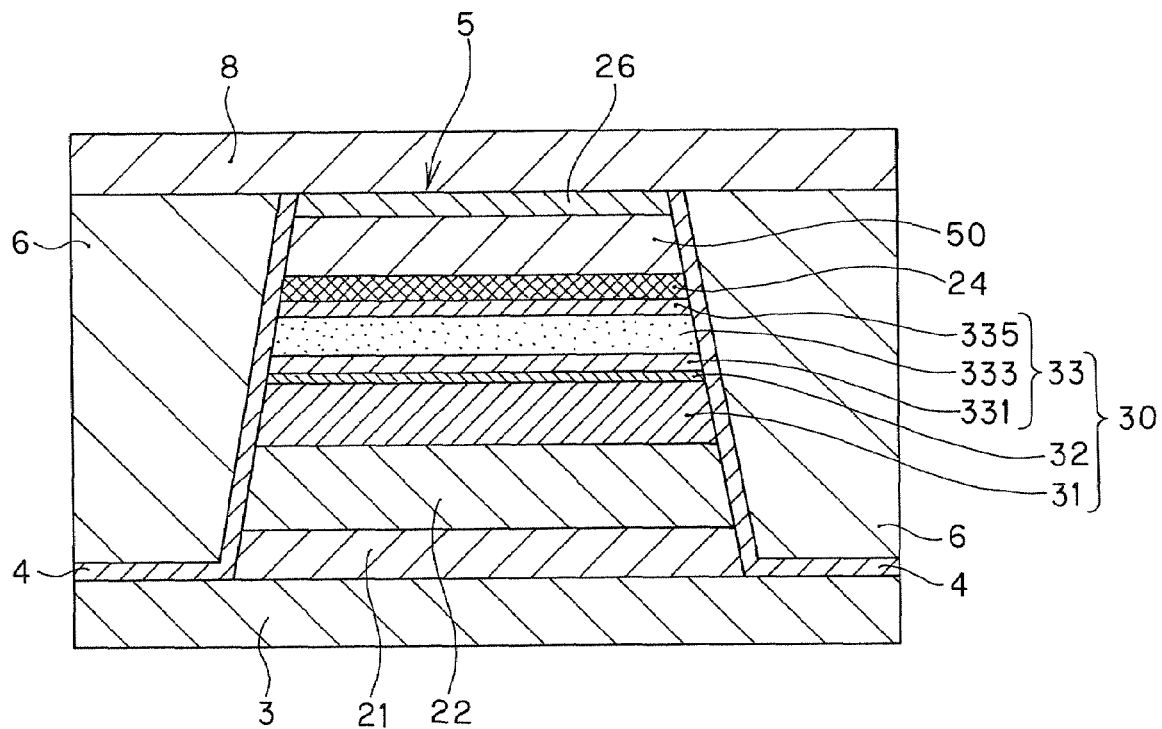
FIG. 5 is illustrative of a modification to FIG. 1; it is illustrative of a modification to the magneto-resistive effect device—part of the invention, as viewed from the ABS.

FIG. 5 is illustrative of another modification to FIG. 1; it is illustrative of another modified embodiment of the magneto-resistive effect device—part of the invention, as viewed from the ABS.

Prior to the explanation of the inventive fabrication process for the magneto-resistive effect device of the CPP (current perpendicular to plane) structure, the construction of the magneto-resistive effect device of the CPP structure is first explained.

[Magneto-Resistive Effect Device of the CPP Structure According to the First Embodiment]

The construction of a reproducing head comprising the inventive magneto-resistive effect device of the CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed to each other, a magneto-resistive effect device 5 (hereinafter referred simply to as the MR device 5) interleaved between the first shield layer 3 and the second shield layer 8, an insulating film 4 adapted to cover two sides of the MR device 5 and a part of the upper surface of the first shield layer 3 along these sides, and two bias magnetic field-applying layers 6 adjacent to the two sides of the MR device 5 via the insulating layer 4.

The first shield layer 3 and the second shield layer 8 take a so-called magnetic shield role plus a pair-of-electrodes role. In other words, they have not only a function of shielding magnetism but also function as a pair of electrodes adapted to pass a sense current through the MR device in a direction intersecting the plane of each of the layers forming the MR device 5, for instance, in a direction perpendicular to the plane of each of the layers forming the MR device (stacking direction).

Apart from the first shield layer 3 and the second shield layer 8, another pair of electrodes may be additionally provided above and below the MR device.

The reproducing head of the invention includes the MR device 5 of the CPP structure—part of the invention.

Referring to the inventive MR device 5 of the CPP structure in terms of a broad, easy-to-understand concept, it comprises a nonmagnetic spacer layer 24, and a fixed magnetization layer 30 and a free layer 50 that are stacked one upon another with the nonmagnetic spacer layer 24 held between them.

And then, a sense current is applied to the MR device 5 in its stacking direction to enable its function. In short, there is the MR device 5 of the CPP (current perpendicular to plane) structure involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22.

(Explanation of the Fixed Magnetization Layer 30)

In the invention, the fixed magnetization layer 30 is formed on the antiferromagnetic layer 22 having a pinning action via an underlay layer 21 formed on the first shield layer 3. The fixed magnetization layer 30 has a so-called synthetic pinned layer comprising, in order from the side of the antiferromagnetic layer 22, an outer pin layer 31, a nonmagnetic intermediate layer 32 and an inner pin layer 33, all stacked together in order.

And, the inner pin layer 33 in the inventive fixed magnetization layer 30 is characterized by being made up of a multilayer structure including a Heusler alloy layer 333, as shown in FIG. 1, wherein Fe layers 332, 334 are formed on both planar sides of the Heusler alloy layer 333 in the stacking direction while the Heusler alloy layer 333 is sandwiched between them. To be more specific, the inner pin layer 33 in the inventive fixed magnetization layer 30 is made up of a multilayer structure comprising, in order from the side of the nonmagnetic intermediate layer 32, an underlay magnetic layer 331, Heusler alloy layer 333, and an intermediate magnetic layer 335.

Each of the aforesaid layers is now explained in greater details.

Outer Pin Layer 31

The outer pin layer 31 is provided by a ferromagnetic layer made of a ferromagnetic material containing Co. The outer 31 and the inner pin layer 33 are antiferromagnetically coupled and fixed such that their magnetization directions are opposite to each other.

The outer pin layer 31 is preferably made of, for instance, a $Co_{70}Fe_{30}$ (atomic %) alloy, and has a thickness of preferably about 3 to 7 nm.

Nonmagnetic Intermediate Layer 32

For instance, the nonmagnetic intermediate layer 32 is made of a nonmagnetic material containing at least one selected from the group consisting of Ru, Rh, Ir, Re, Cr, Zr and Cu, and has a thickness of typically about 0.35 to 1.0 nm. The nonmagnetic intermediate layer 32 is provided to fix the magnetization of the inner pin layer 33 and the magnetization of the outer pin layer 31 in mutually opposite directions. The phrase "magnetization in mutually opposite directions" stands for a broad concept that encompasses not only two such magnetizations in just opposite directions of 180° but those in different directions of 180°±20° as well.

Inner Pin Layer 33

(i) Underlay Magnetic Layer 331

The underlay magnetic layer 331 is made of a Co alloy containing Co. For instance, it should preferably be a magnetic alloy layer of the body-centered cubic structure made of a CoFe alloy. The content of Fe should preferably be equal to or greater than 30 at %. A preferable example is an alloy layer of $Co_{70}Fe_{30}$ (at %). The underlay magnetic layer 331 should have a thickness of about 1 to 2 nm.

(ii) Heusler Alloy Layer 333

The following Heusler alloys could be used.

(1) Heusler Alloy having a General Composition Formula:

$$A_2BC$$

Here A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn.

To be more specific, there is the mention of $Co_2MnSi$, $Co_2MnGe$, $Co_2FeSi$, $Co_2MnAl$, $CO_2FeAl$, and so on.

The aforesaid Heusler alloy is preferably of the $L2_1$ or B2 crystal structure.

(2) Heusler Alloy having a General Composition Formula:

$$ABC$$

Here A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn.

To be more specific, there is the mention of NiMnSb, PtMnSb, and so on.

The aforesaid Heusler alloy is preferably of the C1b crystal structure.

In the invention, preference is given to $Co_2MnSi$, $Co_2MnGe$, $Co_2FeSi$, $Co_2MnAl$, $Co_2FeAl$ and NiMnSb out of the aforesaid Heusler alloys, although $Co_2MnSi$, and $Co_2MnGe$ is most preferred.

Such Heusler alloy layers should have a thickness of about 1 to 7 nm.

(iv) Intermediate Magnetic Layer 335

The intermediate magnetic layer 335 should preferably be a Co alloy layer containing Co. The content of Co should preferably be 30 to 50 at %, because a relatively high polarizability is obtainable in that range. A preferable example is an alloy layer of $FeCo_{30-50}$ having a thickness of about 0.5 to 2 nm.

(Explanation of the Antiferromagnetic Layer 22)

The antiferromagnetic layer 22 works such that by way of exchange coupling with the fixed magnetization layer 30 (outer pinned layer 31 in particular) as described above, the magnetization direction of the outer pinned layer 31 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn should preferably be 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 should have a thickness of about 5 to 30 nm.

The underlay layer 21 underlying the antiferromagnetic layer 22 is provided to improve the crystallization and orientation of each layer formed on it. In particular, that layer is provided to better an exchange coupling between the antiferromagnetic layer 22 and the fixed magnetization layer 30. For such an underlay layer 21, a multilayer structure of, e.g., a Ta layer and a NiCr layer is used. The thickness of the underlay layer 21 should be about 2 to 6 nm.

(Explanation of the Nonmagnetic Spacer Layer 24)

The nonmagnetic spacer layer 24 is interleaved between the fixed magnetization layer 30 and the free layer 50. For instance, the nonmagnetic spacer layer 24 is made of a nonmagnetic, electroconductive material containing at least 80% by weight of at least one out of the group consisting of Cu, Au and Ag, and should preferably have a thickness of about 1 to 4 nm.

(Explanation of the Free Layer 50)

In the invention, the free layer 50 includes on the nonmagnetic spacer layer 24 a multilayer structure comprising an underlay magnetic layer 51 and a Heusler alloy layer 53 stacked one upon another in order, as shown in FIG. 1.

Underlay Magnetic Layer 51

The underlay magnetic layer 51 is made of a Co-containing alloy, and should preferably be a magnetic alloy layer of the body-centered cubic structure comprising, for instance, a CoFe alloy. The content of Co should preferably be 50 to 70 at %, because, in that range, high polarizability is obtained, and there is a decreased coercive force property obtained, which is needed for the free layer. A preferable example is an alloy layer of $Co_{50-70}Fe$ (at %) with a thickness of about 0.5 to 2 nm.

Heusler Alloy Layer 53

The following Heusler alloys could be used.

(1) Heusler Alloy having a General Composition Formula:

$$A_2BC$$

Here A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn.

To be more specific, there is the mention of $Co_2MnSi$, $Co_2MnGe$, $Co_2FeSi$, $Co_2MnAl$, $Co_2FeAl$, and so on.

The aforesaid Heusler alloy is preferably of the $L2_1$ or B2 crystal structure.

(2) Heusler Alloy having a General Composition Formula:

$$ABC$$

Here A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn.

To be more specific, there is the mention of NiMnSb, PtMnSb, and so on.

The aforesaid Heusler alloy is preferably of the C1b crystal structure.

In the invention, preference is given to $Co_2MnSi$, $Co_2MnGe$, $Co_2FeSi$, $Co_2MnAl$, $Co_2FeAl$ and NiMnSb out of the Heusler alloys, although $Co_2MnSi$, and $Co_2MnGe$ is most preferred.

Such Heusler alloy layers should have a thickness of about 1 to 7 nm.

On the free layer 50 there is a protective layer 26 of, e.g., ruthenium formed with a thickness of about 0.5 to 10 nm.

For instance, the insulating layer 4 is made of alumina. For the bias magnetic field-applying layer 6, a hard magnetic layer (hard magnet) or a multilayer structure of a hard magnetic material and an anti-ferromagnetic layer is used. To be more specific, CoPt or CoCrPt may be used.

[Magneto-Resistive Effect Device of the CPP Structure According to the Second Embodiment]

The magneto-resistive effective device of the CPP structure according to the second embodiment of the invention is now explained with reference to FIG. 4. The magneto-resistive effect device of the CPP structure according to the second embodiment shown in FIG. 4 differs from the aforesaid first embodiment in that a Heusler alloy layer 53 is applied to a free layer 50 alone.

More specifically, the magneto-resistive effect device of the CPP structure according to the second embodiment shown in FIG. 4 takes on a form that comprises, in order from the side of an underlay layer 21, an anti-ferromagnetic layer 22, an outer pin layer 31, a nonmagnetic intermediate layer 32, an inner pin layer 33, a nonmagnetic spacer layer 24, and a free layer 50 (a multilayer structure comprising underlay magnetic layer 51 and Heusler alloy layer 53) stacked one upon another.

In the second embodiment shown in FIG. 4, the inner pin layer 33, for instance, is made up of a single layer. For instance, it is preferably a Co alloy layer containing Co such as a CoFe alloy layer wherein the content of Fe is preferably 20 to 80 at %. In the second embodiment, the inner pin layer 33 should have a thickness of about 2 to 7 nm. The inner pin layer 33 may have a multilayer structure of a Co alloy layer containing Co and a Cu layer, wherein the Cu layer should have a thickness of about 0.1 to 0.5 nm.

Referring to the materials and structures of the layers except the inner layer 33, the second embodiment may be much the same as the aforesaid first embodiment.

[Magneto-Resistive Effect Device of the CPP Structure According to the Third Embodiment]

The magneto-resistive effective device of the CPP structure according to the third embodiment of the invention is now explained with reference to FIG. 5. The magneto-resistive effect device of the CPP structure according to the third embodiment shown in FIG. 5 differs from the aforesaid first embodiment in that a Heusler alloy layer 333 is applied to only an inner pin layer in a fixed magnetization layer 30. More specifically, the magneto-resistive effect device of the CPP structure according to the third embodiment shown in FIG. 5 takes on a form that comprises, in order from the side of an underlay layer 21, an antiferromagnetic layer 22, an outer pin layer 31, a nonmagnetic intermediate layer 32, an inner pin layer 33 (a multilayer structure comprising underlay magnetic layer 331, Heusler alloy layer 333 and intermediate magnetic layer 335), a nonmagnetic spacer layer 24 and a free layer 50 stacked one upon another.

In the third embodiment shown in FIG. 5, the free layer 50, for instance, is made up of a single layer. For instance, it is preferably a Co alloy layer containing Co such as a CoFe alloy layer wherein the content of Co is preferably 50 to 70 at %. In the third embodiment, the free layer 50 should have a thickness of about 2 to 7 nm.

Referring to the materials and structures of the layers except the free layer 50, the third embodiment may be much the same as the aforesaid first embodiment.

[Fabrication Process for the Magneto-Resistive Effect Device of the CPP Structure]

The magneto-resistive effect device of the CPP structure according to each of the aforesaid first, second and third embodiments of the invention, for instance, may be formed by means of vacuum film-formation techniques such as sputtering.

In particular, part of the fabrication process of the invention resides in the formation of the first Heusler alloy layer 53 that constitutes a part of the aforesaid free layer 50 or the second Heusler alloy layer 333 that constitutes a part of the aforesaid inner pin layer 33 by means of a co-sputtering technique using a split target broken down into at least two sub-targets in such a way as to constitute a Heusler alloy layer composition.

When a layer is formed by sputtering using one single target corresponding to a Heusler alloy layer itself instead of using such a split target, there will be inconvenience such as a crack in the target itself if the input power for sputtering is increased for an increased layer-formation rate. It is thus impossible to boost productivity, and there is inconvenience such as the inability of obtain a Heusler alloy layer having the expected layer characteristics.

When sequential sputtering rather than co-sputtering is carried out with the split target, there will be a time lag in sputtering for each sub-target, which will in turn cause impurities (oxygen, etc.) in the film-formation atmosphere to go readily along with the ensuing film, making degradation of film quality likely. There will be poor productivity and inconvenience such as inconsistent film quality. The "co-sputtering" here refers to a sputtering technique in which sputtering is started with the sub-targets with no time lag, that is, concurrently.

In the formation of the device according to the invention, it is only the formation of the Heusler alloy layer that the split sub-targets do a favor.

When the Heusler alloy layer is formed, the target should preferably be split into sub-targets as follows.

(Form of Splitting the Target)

When the composition having the aforesaid general composition formula: $A_2BC$ is used as the Heusler alloy layer, it is preferable that two split sub-targets broken down into (1) an alloy of A plus B, and C are used or, alternatively, (2) two split sub-targets broken down into an alloy of A plus B and an alloy of A plus C are used. Although the reason has yet to be clarified, the adoption of other splitting forms would not often let the invention take effect.

When the composition having the aforesaid general composition formula: ABC is used as the Heusler alloy layer, it is preferable that two split sub-targets broken down into an alloy of A plus B, and C are used. Although the reason has yet to be clarified, the adoption of other splitting forms would not often let the invention take effect.

Sputtering should preferably be implemented under the following preferable conditions:

Target voltage: 200 to 600 V;
Target average current density: 0.5 to 1.0 $mA/cm^2$;
Film-deposition rate: at least 0.2 Å/sec.;
Film-formation pressure: up to 5 mTorr; and
The degree of vacuum reached: up to $1 \times 10^{-6}$ Pa The inventive co-sputtering using the split target should preferably be implemented at a film-deposition rate of at least 0.2 Å/sec. in general and 0.2 to 0.5 Å/sec. in particular. A value of less than 0.2 Å/sec. is not preferable in view of productivity, and a Heusler alloy layer of better quality is obtainable at greater than 0.2 Å/sec., although the reason involved remains unclarified.

According to the invention, the film-deposition rate can be brought up without taking care of cracks in the target, so that there can be a film of better quality obtained.

(Explanation of the Whole Construction of the Thin-Film Magnetic Head)

For a much better understanding of the magneto-resistive effect device of the CPP structure that is to be fabricated by the invention, the whole construction of the thin-film magnetic head comprising the aforesaid magneto-resistive effect device of the CPP structure is now explained.

As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3$.TiC). That insulating layer has a thickness of typically about 0.5 to 20 μm.

Then, a lower shield layer 3 comprising a magnetic material and adapted for a reproducing head is formed on that insulating layer 2. The shield layer 3 has a thickness of typically about 0.1 to 5 μm. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing MR device 5 is formed on the lower shield layer 3. The Heusler alloy layer that constitutes a part of the magneto-resistive effect device 5 of the CPP structure is formed by such a co-sputtering technique using a split target as described above.

Although not shown, an insulating film is then formed in such a way as to cover two sides of the MR device and the upper surface of the first shield layer 3. The insulating film is formed of an insulating material such as alumina.

Then, two bias magnetic field-applying layers 6 are formed in such a way as to be adjacent to the two sides of the MR device 5 via the insulating layer. Then, an insulating film 7 is formed in such a way as to be located around the MR device 5 and bias magnetic field-applying layers 6. The insulating film 7 is formed of an insulating material such as alumina.

Then, a second shield layer 8 for the reproducing head, comprising a magnetic material, is formed on the MR device 5, bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer should be about 50 to 300 nm in thickness.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is built up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion layer 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 µm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The recording head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin-film coils 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. The "throat height" here means a length (height) from the medium opposite plane 20 to a position at which the two magnetic pole layers start being spaced away.

How the thin-film magnetic head works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to a direction perpendicular to the medium opposite plane 20. At the magneto-resistive effect device 5 of the CPP structure with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the magneto-resistive effect device 5 of the CPP structure, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the magneto-resistive effect device of the CPP structure. The resistance value of the magneto-resistive effect device 5 of the CPP structure may be found from a potential difference between the first and second shield layers 3 and 8, i.e., the two electrode layers 3 and 8 at the time when a sense current is passed through the MR device. It is thus possible for the reproducing head to play back the information recorded in the recording medium.

How to fabricate the inventive magneto-resistive effect device of the CPP structure as described above is now explained in further details with reference to the following specific examples.

EXPERIMENTAL EXAMPLE I

The multilayer structure construction of the magneto-resistive effect device of the CPP structure was designed as set out in Table 1, and a device was prepared pursuant to that design. That is, the multiple layers set out in Table 1 were formed in order on a lower electrode-cum-lower shield layer composed of permalloy by means of sputtering. Further, an upper electrode-cum-upper shield layer made of permalloy was formed on the Ru protective film of the obtained multilayer structure.

TABLE 1

(Heusler alloy: $Co_2MnSi$)

| Construction of the multilayer layer | | | Material | Thickness (Å) |
|---|---|---|---|---|
| Protective layer | | | Ru | 100 |
| Free layer | First Heusler alloy layer | | $Co_2MnSi$ | 40 |
| | Underlay layer | | FeCo | 10 |
| Nonmagnetic intermediate layer | | | Cu | 20 |
| Fixed magnetization layer | Inner pin layer | Intermediate magnetic layer | FeCo | 10 |
| | | Second Heusler alloy layer | $Co_2MnSi$ | 30 |
| | | Underlay magnetic layer | CoFe | 10 |
| | Nonmagnetic intermediate layer | | Ru | 8 |
| | Outer pin layer | | FeCo | 30 |
| Antiferromagnetic layer | | | IrMn | 50 |
| Underlay layer | | | Ta/Ru | 10/20 |

For the first and second Heusler alloy layers referred to in Table 1, samples comprising various Heusler alloy layers having varied layer states were prepared according to the way described set out in Table 2, given below, while sputtering was implemented in varied modes and under varied conditions.

The junction scale for each sample was 0.2 μm×0.2 μm, and each device was annealed at 290° C., for 3 hours.

After annealing, the samples were measured for their MR ratios by virtue of an ordinary 4-terminal method, as shown in Table 2, given just below. The MR ratio is a quotient obtained by dividing the amount of resistivity change ΔR by resistance value R, and given by ΔR/R. Usually, this value is given in terms of percent multiplied by 100. Note here that the MR ratio is worked out as an average of 100 device samples.

Figure 6:
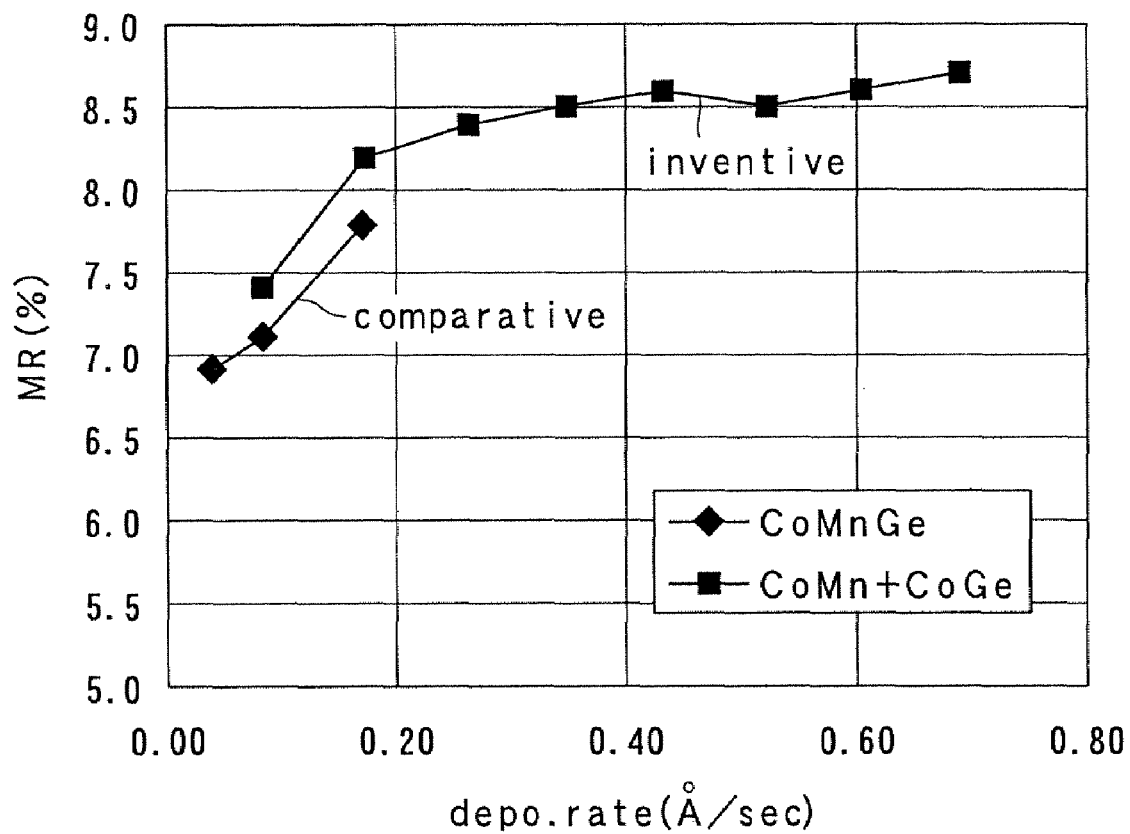
FIG. 6 is a graph indicative of film-deposition rate versus MR (%) relations on the basis of experimental data.

Whether or not there was a crack in the target at the time of forming the Heusler alloy layer by sputtering was also checked. Whether or not there was a crack in the target was judged from the inconsistency of sputtering discharge, and at the time when the crack seemed to appear, the sputtering operation was stopped for visual observation. The target with a crack is indicated as "found" in Table 2.

formance worse than co-sputtering. For a better visual understanding of data, the data values of Table 2 (except those of Comparative Example 1-5) are graphically presented in FIG. 6.

EXPERIMENTAL EXAMPLE II

The multilayer structure construction of the magneto-resistive effect device of the CPP structure was designed as set out in Table 3 give below, and a device was prepared pursuant to that design. That is, the multiple layers set out in Table 3 were formed in order on a lower electrode-cum-lower shield layer composed of permalloy by means of sputtering. Further, an upper electrode-cum-upper shield layer made of permalloy was formed on the Ru protective film of the obtained multilayer structure.

TABLE 2

| Sample | Sputtering mode | Target material Target 1 | Target material Target 2 | Input Power Target 1 ($W/cm^2$) | Input Power Target 2 ($W/cm^2$) | Film-deposition rate (Å/sec) | MR (%) | Target crack |
|---|---|---|---|---|---|---|---|---|
| Ex. 1-1 | Co-sputtering | CoMn | Si | 0.4 | 0.1 | 0.09 | 7.4 | None |
| Ex. 1-2 | Co-sputtering | CoMn | Si | 0.7 | 0.2 | 0.18 | 8.2 | None |
| Ex. 1-3 | Co-sputtering | CoMn | Si | 1.1 | 0.4 | 0.26 | 8.4 | None |
| Ex. 1-4 | Co-sputtering | CoMn | Si | 1.4 | 0.5 | 0.35 | 8.5 | None |
| Ex. 1-5 | Co-sputtering | CoMn | Si | 1.8 | 0.6 | 0.43 | 8.6 | None |
| Ex. 1-6 | Co-sputtering | CoMn | Si | 2.1 | 0.7 | 0.52 | 8.5 | None |
| Ex. 1-7 | Co-sputtering | CoMn | Si | 2.5 | 0.8 | 0.60 | 8.6 | None |
| Ex. 1-8 | Co-sputtering | CoMn | Si | 2.8 | 0.9 | 0.69 | 8.7 | None |
| Ex. 1-9 | Co-sputtering | CoMn | Si | 3.2 | 1.1 | 0.78 | — | Found |
| Comp. Ex. 1-1* | Ordinary | $Co_2MnSi$ | — | 0.2 | — | 0.04 | 6.9 | None |
| Comp. Ex. 1-2* | Ordinary | $Co_2MnSi$ | — | 0.5 | — | 0.08 | 7.1 | None |
| Comp. Ex. 1-3* | Ordinary | $Co_2MnSi$ | — | 0.9 | — | 0.17 | 7.8 | None |
| Comp. Ex. 1-4* | Ordinary | $Co_2MnSi$ | — | 1.4 | — | 0.26 | — | Found |
| Comp. Ex. 1-5* | Sequential sputtering | $Co_2Mn$ | Si | 1.8 | 0.6 | 0.43 | 7.4 | None |

The results of Table 2 reveal that in Comparative Examples 1-1 to 1-4 each using a single target that is the same in composition as the Heusler alloy layer, there is a crack in the target occurring prematurely as the input power to the target increases. As a result, it is impossible to prepare a film at a high film-deposition rate at which good quality would seem to be obtainable.

With the co-sputtering using the split target according to the invention (inventive examples), on the other hand, it is possible to increase the input power because there is no or little crack in the target. The film-deposition rate can thus be brought up to an area at which good film quality is achievable, and there are productivity improvements as well.

Further, sequential sputtering using the split target (Comparative Example 1-5) is more likely to render the MR per-

TABLE 3

| (Heusler alloy: $Co_2MnGe$) | | | |
|---|---|---|---|
| Construction of the multilayer film | | Material | Thickness (Å) |
| Protective layer | | Ru | 100 |
| Free layer | First Heusler alloy layer | $Co_2MnGe$ | 40 |
| | Underlay magnetic layer | FeCo | 10 |
| Nonmagnetic spacer layer | | Cu | 20 |

TABLE 3-continued (Heusler alloy: $Co_2MnGe$)

| Construction of the multiplayer film | | | Material | Thickness (Å) |
|---|---|---|---|---|
| Fixed magnetization layer | Inner pin layer | Intermediate magnetic layer | FeCo | 10 |
| | | Second Heusler alloy layer | $Co_2MnGe$ | 30 |
| | | Underlay magnetic layer | CoFe | 10 |
| Nonmagnetic intermediate layer | | | Ru | 8 |
| Outer pin layer | | | FeCo | 30 |
| Antiferromagnetic layer | | | IrMn | 50 |
| Underlay layer | | | Ta/Ru | 10/20 |

For the first and second Heusler alloy layers referred to in Table 3, samples comprising various Heusler alloy layers having varied layer states were prepared according to the way described set out in Table 3, given just below, while sputtering was implemented in varied modes and under varied conditions. The junction scale for each sample was 0.2 μm×0.2 μm, and each device was annealed at 290° C. for 3 hours.

After annealing, the samples were measured for their MR ratios by virtue of an ordinary 4-terminal method, as shown in Table 4, given just below. The MR ratio is a quotient obtained by dividing the amount of resistivity change ΔR by resistance value R, and given by ΔR/R. Usually, this value is given in terms of percent multiplied by 100. Note here that the MR ratio is worked out as an average of 100 device samples.

Whether or not there was a crack in the target at the time of forming the Heusler alloy layer by sputtering was also checked. Whether or not there was a crack in the target was judged from the inconsistency of sputtering discharge, and at the time when the crack seemed to appear, the sputtering operation was stopped for visual observation. The target with a crack is indicated as "found" in Table 4.

TABLE 4

| Sample | Sputtering mode | Target material Target 1 | Target material Target 2 | Input Power Target 1 (W/cm$^2$) | Input Power Target 2 (W/cm$^2$) | Film-deposition rate (Å/sec) | MR (%) | Target crack |
|---|---|---|---|---|---|---|---|---|
| Ex. 2-1 | Co-sputtering | CoMn | CoGe | 0.2 | 0.3 | 0.07 | 8.0 | None |
| Ex. 2-2 | Co-sputtering | CoMn | CoGe | 0.4 | 0.6 | 0.15 | 8.8 | None |
| Ex. 2-3 | Co-sputtering | CoMn | CoGe | 0.6 | 0.8 | 0.22 | 9.0 | None |
| Ex. 2-4 | Co-sputtering | CoMn | CoGe | 0.8 | 1.1 | 0.30 | 9.0 | None |
| Ex. 2-5 | Co-sputtering | CoMn | CoGe | 1.0 | 1.4 | 0.37 | 9.2 | None |
| Ex. 2-6 | Co-sputtering | CoMn | CoGe | 1.2 | 1.7 | 0.44 | 9.1 | None |
| Ex. 2-7 | Co-sputtering | CoMn | CoGe | 1.6 | 2.2 | 0.58 | 9.2 | None |
| Ex. 2-8 | Co-sputtering | CoMn | CoGe | 1.8 | 2.5 | 0.66 | 9.3 | None |
| Ex. 2-9 | Co-sputtering | CoMn | CoGe | 2.0 | 2.8 | 0.74 | 9.1 | None |
| Ex. 2-10 | Co-sputtering | CoMn | CoGe | 2.3 | 3.3 | 0.89 | — | Found |
| Comp. Ex. 2-1* | Ordinary | $Co_2MnGe$ | — | 0.2 | — | 0.04 | 6.7 | None |
| Comp. Ex. 2-2* | Ordinary | $Co_2MnGe$ | — | 0.5 | — | 0.08 | 7.5 | None |
| Comp. Ex. 2-3* | Ordinary | $Co_2MnGe$ | — | 0.9 | — | 0.17 | 8.4 | None |
| Comp. Ex. 2-4* | Ordinary | $Co_2MnGe$ | — | 1.4 | — | 0.26 | — | Found |
| Comp. Ex. 2-5* | Sequential sputtering | CoMn | CoGe | 1.0 | 1.4 | 0.37 | 8.1 | None |

The results of Table 4 reveal that in Comparative Examples 2-1 to 2-4 each using a single target that is the same in composition as the Heusler alloy layer, there is a crack in the target occurring prematurely as the input power to the target increases, resulting in the inability to prepare a film at a high film-deposition rate at which good quality would seem to be obtainable.

With the co-sputtering using the split target according to the invention (inventive examples), on the other hand, it is possible to increase the input power because there is no or little crack in the target. The film-deposition rate can thus be brought up to an area at which good film quality is achievable, and there are productivity improvements as well.

Figure 7:
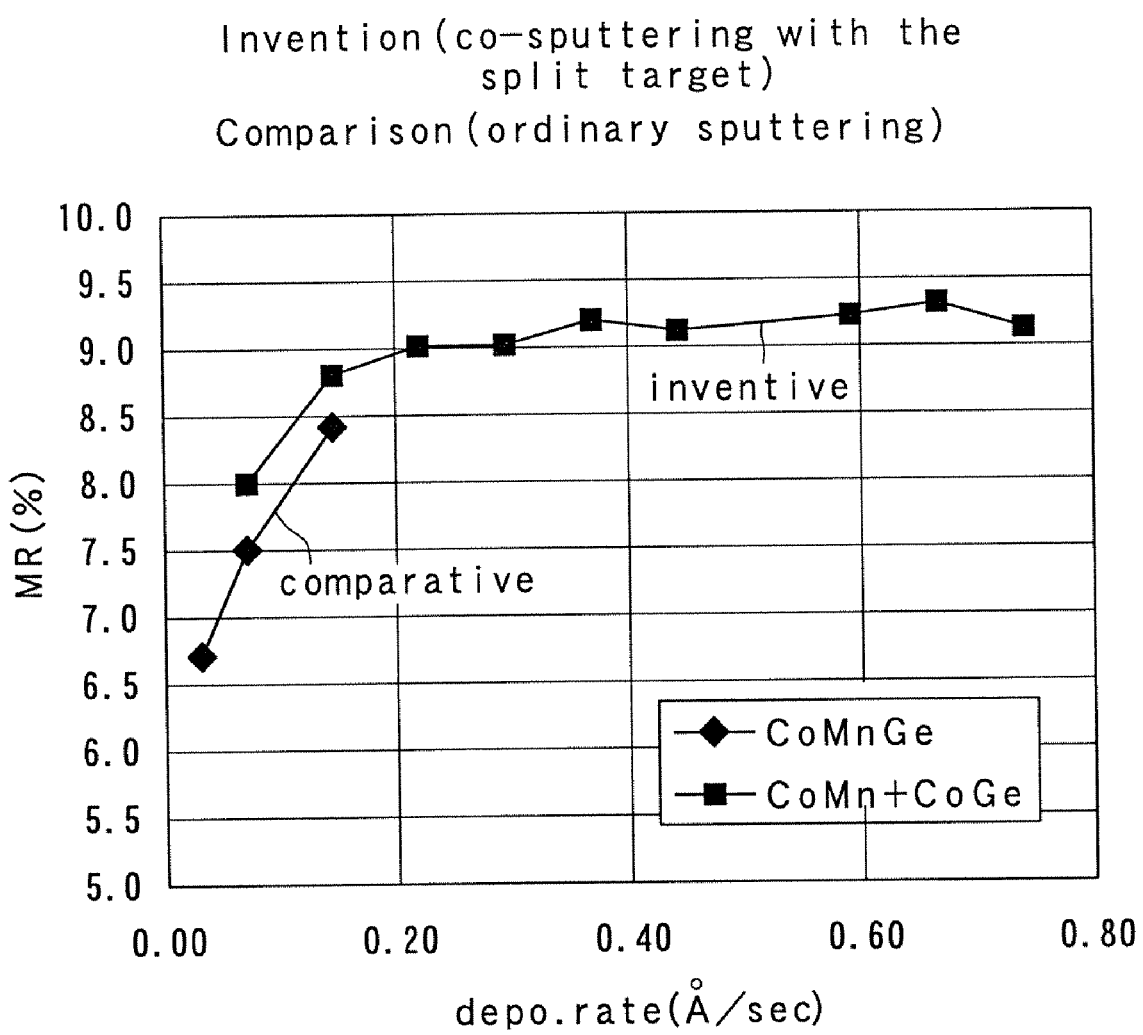
FIG. 7 is a graph indicative of film-deposition rate versus MR (%) relations on the basis of experimental data.

Further, sequential sputtering using the split target (Comparative Example 2-5) is more likely to render the MR performance worse than co-sputtering. For a better visual understanding of data, the data values of Table 4 (except those of Comparative Example 2-5) are graphically presented in FIG. 7.

EXPERIMENTAL EXAMPLE III

The multilayer structure construction of the magneto-resistive effect device of the CPP structure was designed as set out in Table 5 given below, and a device was prepared pursuant to that design. That is, the multiple layers set out in Table 5 were formed in order on a lower electrode-cum-lower shield layer composed of permalloy by means of sputtering. Further, an upper electrode-cum-upper shield layer made of permalloy was formed on the Ru protective film of the obtained multilayer structure.

TABLE 5

(Heusler alloy: $Co_2FeSi$)

| Construction of the multilayer structure | | | Material | Thickness (Å) |
|---|---|---|---|---|
| | Protective layer | | Ru | 100 |
| Free layer | First Heusler alloy layer | | $Co_2FeSi$ | 40 |
| | Underlay magnetic layer | | FeCo | 10 |

TABLE 5-continued (Heusler alloy: $Co_2FeSi$)

| Construction of the multilayer structure | | | Material | Thickness (Å) |
|---|---|---|---|---|
| Nonmagnetic spacer layer | | | Cu | 20 |
| Fixed magnetization layer | Inner pin layer | Intermediate magnetic layer | FeCo | 10 |
| | | Second Heusler alloy layer | $Co_2FeSi$ | 30 |
| | | Underlay magnetic layer | CoFe | 10 |
| Nonmagnetic intermediate layer | | | Ru | 8 |
| Outer pin layer | | | FeCo | 30 |
| Antiferromagnetic layer | | | IrMn | 50 |
| Underlay layer | | | Ta/Ru | 10/20 |

For the first and second Heusler alloy layers referred to in Table 5, samples comprising various Heusler alloy layers having varied layer states were prepared according to the way described set out in Table 6, given just below, while sputtering was implemented in varied modes and under varied conditions. The junction scale for each sample was 0.2 μm×0.2 μm, and each device was annealed at 290° C. for 3 hours.

After annealing, the samples were measured for their MR ratios by virtue of an ordinary 4-terminal method, as shown in Table 6, given just below. The MR ratio is a quotient obtained by dividing the amount of resistivity change ΔR by resistance value R, and given by ΔR/R. Usually, this value is given in terms of percent multiplied by 100. Note here that the MR ratio is worked out as an average of 100 device samples.

Whether or not there was a crack in the target at the time of forming the Heusler alloy layer by sputtering was also checked. Whether or not there was a crack in the target was judged from the inconsistency of sputtering discharge, and at the time when the crack seemed to appear, the sputtering operation was stopped for visual observation. The target with a crack is indicated as "found" in Table 6.

TABLE 6

| Sample | Sputtering mode | Target material Target 1 | Target 2 | Input Power Target 1 (W/cm²) | Target 2 (W/cm²) | Film-deposition rate (Å/sec) | MR (%) | Target crack |
|---|---|---|---|---|---|---|---|---|
| Ex. 3-1 | Co-sputtering | CoFe | Si | 0.4 | 0.1 | 0.09 | 7.0 | None |
| Ex. 3-2 | Co-sputtering | CoFe | Si | 0.7 | 0.2 | 0.19 | 7.6 | None |
| Ex. 3-3 | Co-sputtering | CoFe | Si | 1.1 | 0.4 | 0.28 | 7.8 | None |
| Ex. 3-4 | Co-sputtering | CoFe | Si | 1.4 | 0.5 | 0.37 | 7.7 | None |
| Ex. 3-5 | Co-sputtering | CoFe | Si | 1.8 | 0.6 | 0.46 | 7.8 | None |
| Ex. 3-6 | Co-sputtering | CoFe | Si | 2.1 | 0.7 | 0.55 | 7.8 | None |
| Ex. 3-7 | Co-sputtering | CoFe | Si | 2.8 | 0.9 | 0.73 | 7.8 | None |
| Ex. 3-8 | Co-sputtering | CoFe | Si | 3.2 | 1.1 | 0.83 | 7.9 | None |
| Ex. 3-9 | Co-sputtering | CoFe | Si | 3.6 | 1.2 | 0.92 | — | Found |

TABLE 6-continued

| Sample | Sputtering mode | Target material Target 1 | Target material Target 2 | Input Power Target 1 (W/cm$^2$) | Input Power Target 2 (W/cm$^2$) | Film-deposition rate (Å/sec) | MR (%) | Target crack |
|---|---|---|---|---|---|---|---|---|
| Comp. Ex. 3-1* | Ordinary | Co$_2$FeSi | — | 0.2 | — | 0.04 | 6.1 | None |
| Comp. Ex. 3-2* | Ordinary | Co$_2$FeSi | — | 0.5 | — | 0.09 | 6.4 | None |
| Comp. Ex. 3-3* | Ordinary | Co$_2$FeSi | — | 0.9 | — | 0.18 | 6.8 | None |
| Comp. Ex. 3-4* | Ordinary | Co$_2$FeSi | — | 1.4 | — | 0.28 | 7.0 | None |
| Comp. Ex. 3-5* | Ordinary | Co$_2$FeSi | — | 1.9 | — | 0.35 | — | Found |
| Comp. Ex. 3-6* | Sequential sputtering | CoFe | Si | 2.1 | 0.7 | 0.55 | 7.1 | None |

The results of Table 6 reveal that in Comparative Examples 3-1 to 3-5 each using a single target that is the same in composition as the Heusler alloy layer, there is a crack in the target occurring prematurely as the input power to the target increases, resulting in the inability to prepare a film at a high film-deposition rate at which good quality would seem to be obtainable.

With the co-sputtering using the split target according to the invention (inventive examples), on the other hand, it is possible to increase the input power because there is no or little crack in the target. The film-deposition rate can be brought up to an area at which good film quality is achievable, and there are productivity improvements as well.

Figure 8:
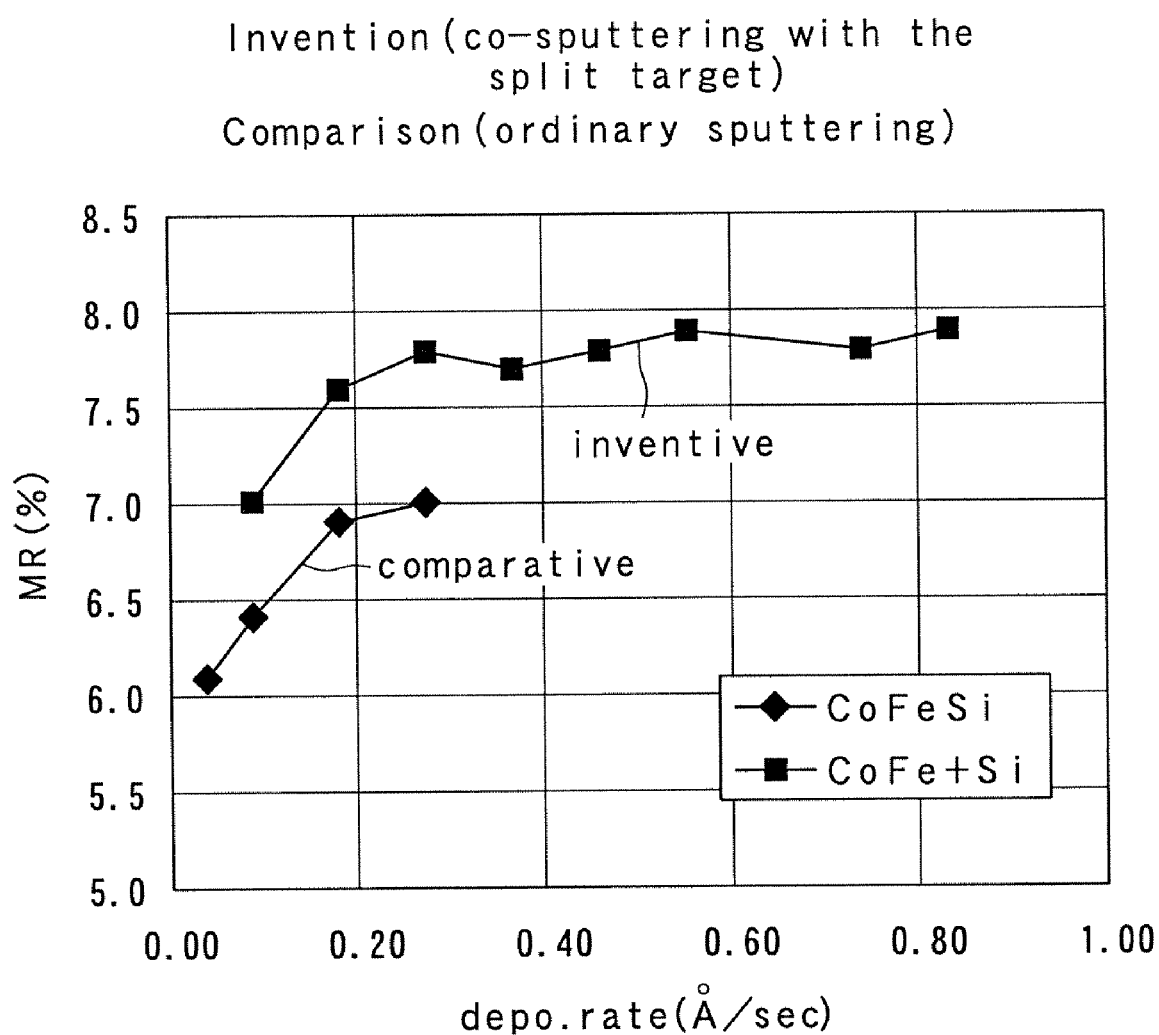
FIG. 8 is a graph indicative of film-deposition rate versus MR (%) relations on the basis of experimental data.

Further, sequential sputtering using the split target (Comparative Example 3-6) is more likely to render the MR performance worse than co-sputtering. For a better visual understanding of data, the data values of Table 6 (except those of Comparative Example 3-6) are graphically presented in FIG. 8.

EXPERIMENTAL EXAMPLE IV

The multilayer structure construction of the magneto-resistive effect device of the CPP structure was designed as set out in Table 7 given below, and a device was prepared pursuant to that design. That is, the multiple layers set out in Table 7 were formed in order on a lower electrode-cum-lower shield layer composed of permalloy by means of sputtering. Further, an upper electrode-cum-upper shield layer made of permalloy was formed on the Ru protective film of the obtained multilayer structure.

TABLE 7

(Heusler alloy: Co$_2$MnGe for the inner pin layer alone)

| Construction of the multilayer film | | | Material | Thickness (Å) |
|---|---|---|---|---|
| Protective layer | | | Ru | 100 |
| Free layer | Soft magnetic free layer | | NiFe | 50 |
| | Underlay magnetic layer | | FeCo | 15 |

TABLE 7-continued (Heusler alloy: Co$_2$MnGe for the inner pin layer alone)

| Construction of the multilayer film | | | Material | Thickness (Å) |
|---|---|---|---|---|
| Nonmagnetic spacer layer | | | Cu | 20 |
| Fixed magnetization layer | Inner pin layer | Intermediate magnetic layer | FeCo | 10 |
| | | Heusler alloy layer | Co$_2$MnGe | 40 |
| | | Underlay magnetic layer | CoFe | 10 |
| | Nonmagnetic intermediate layer | | Ru | 8 |
| | Outer pin layer | | FeCo | 35 |
| Antiferromagnetic layer | | | IrMn | 50 |
| Underlay layer | | | Ta/Ru | 10/20 |

It is here noted that the Heusler alloy layer referred to in Table 7 is found in the inner pin layer alone: it is not found in the free layer.

Samples comprising various Heusler alloy layers having varied layer states were prepared according to the way described set out in Table 8, given just below, while sputtering was implemented in varied modes and under varied conditions. The junction scale for each sample was 0.2 μm×0.2 μm, and each device was annealed at 290° C. for 3 hours.

After annealing, the samples were measured for their MR ratios by virtue of an ordinary 4-terminal method, as shown in Table 8, given just below. The MR ratio is a quotient obtained by dividing the amount of resistivity change ΔR by resistance value R, and given by ΔR/R. Usually, this value is given in terms of percent multiplied by 100. Note here that the MR ratio is worked out as an average of 100 device samples.

Whether or not there was a crack in the target at the time of forming the Heusler alloy layer by sputtering was also checked. Whether or not there was a crack in the target was judged from the inconsistency of sputtering discharge, and at the time when the crack seemed to appear, the sputtering operation was stopped for visual observation. The target with a crack is indicated as "found" in Table 8.

TABLE 8

| Sample | Sputtering mode | Target material Target 1 | Target material Target 2 | Input Power Target 1 (W/cm²) | Input Power Target 2 (W/cm²) | Film-deposition rate (Å/sec) | MR (%) | Target crack |
|---|---|---|---|---|---|---|---|---|
| Ex. 4-1 | Co-sputtering | CoMn | CoGe | 0.2 | 0.3 | 0.07 | 6.5 | None |
| Ex. 4-2 | Co-sputtering | CoMn | CoGe | 0.4 | 0.6 | 0.15 | 7.0 | None |
| Ex. 4-3 | Co-sputtering | CoMn | CoGe | 0.6 | 0.8 | 0.22 | 7.1 | None |
| Ex. 4-4 | Co-sputtering | CoMn | CoGe | 0.8 | 1.1 | 0.30 | 7.2 | None |
| Ex. 4-5 | Co-sputtering | CoMn | CoGe | 1.0 | 1.4 | 0.37 | 7.1 | None |
| Ex. 4-6 | Co-sputtering | CoMn | CoGe | 1.2 | 1.7 | 0.44 | 7.0 | None |
| Ex. 4-7 | Co-sputtering | CoMn | CoGe | 1.6 | 2.2 | 0.58 | 7.1 | None |
| Ex. 4-8 | Co-sputtering | CoMn | CoGe | 1.8 | 2.5 | 0.66 | 7.0 | None |
| Ex. 4-9 | Co-sputtering | CoMn | CoGe | 2.0 | 2.8 | 0.74 | 7.0 | None |
| Ex. 4-10 | Co-sputtering | CoMn | CoGe | 2.3 | 3.3 | 0.89 | — | Found |
| Comp. Ex. 4-1* | Ordinary | Co$_2$MnGe | — | 0.2 | — | 0.04 | 5.2 | None |
| Comp. Ex. 4-2* | Ordinary | Co$_2$MnGe | — | 0.5 | — | 0.07 | 6.0 | None |
| Comp. Ex. 4-3* | Ordinary | Co$_2$MnGe | — | 0.9 | — | 0.15 | 6.2 | None |
| Comp. Ex. 4-4* | Ordinary | Co$_2$MnGe | — | 1.4 | — | 0.22 | — | Found |
| Comp. Ex. 4-5* | Sequential sputtering | CoMn | CoGe | 1.0 | 1.4 | 0.37 | 6.4 | None |

The results of Table 8 reveal that in Comparative Examples 4-1 to 4-4 each using a single target that is the same in composition as the Heusler alloy layer, there is a crack in the target occurring prematurely as the input power to the target increases, resulting in the inability to prepare a film at a high film-deposition rate at which good quality would seem to be obtainable.

With the co-sputtering using the split target according to the invention (inventive examples), on the other hand, it is possible to increase the input power because there is no or little crack in the target. The film-deposition rate can be brought up to an area at which good film quality is achievable, and there are productivity improvements as well.

Figure 9:
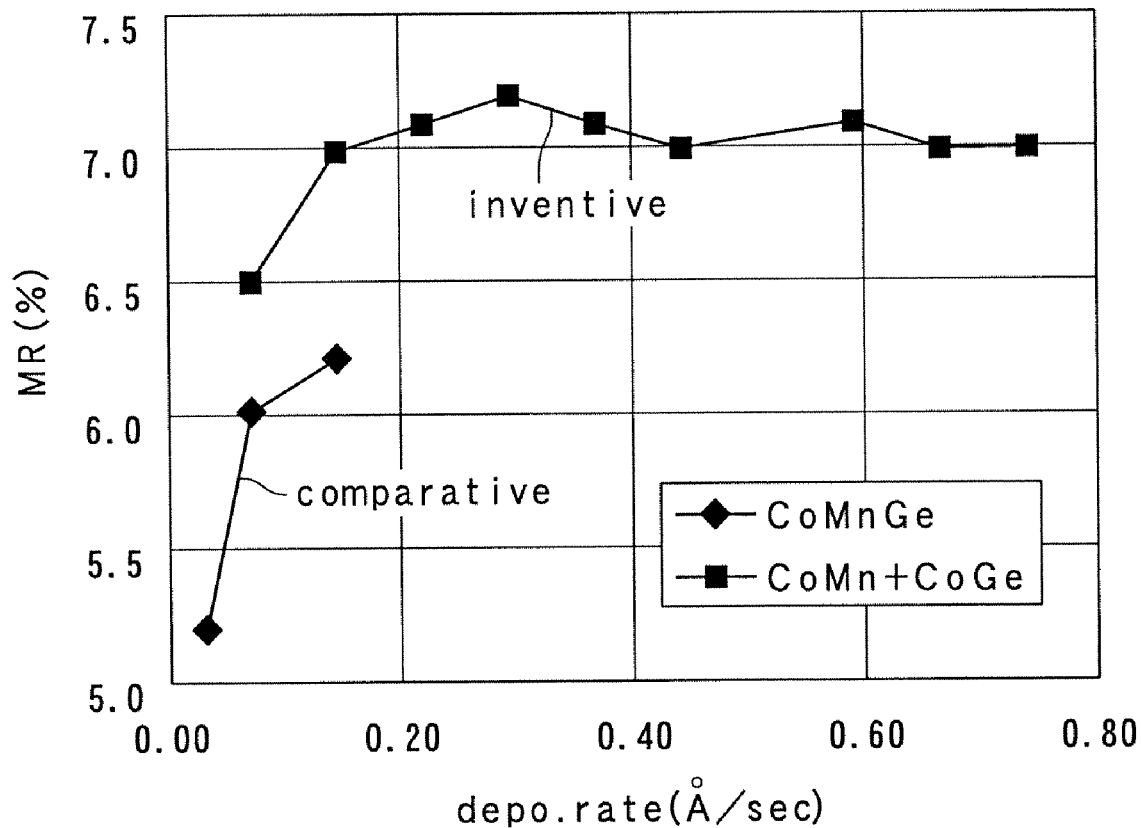
FIG. 9 is a graph indicative of film-deposition rate versus MR (%) relations on the basis of experimental data.

Further, sequential sputtering using the split target (Comparative Example 4-5) is more likely to render the MR performance worse than co-sputtering. For a better visual understanding of data, the data values of Table 8 (except those of Comparative Example 4-5) are graphically presented in FIG. 9.

EXPERIMENTAL EXAMPLE V

The multilayer structure construction of the magneto-resistive effect device of the CPP structure was designed as set out in Table 9 given below, and a device was prepared pursuant to that design. That is, the multiple layers set out in Table 9 were formed in order on a lower electrode-cum-lower shield layer composed of permalloy by means of sputtering. Further, an upper electrode-cum-upper shield layer made of permalloy was formed on the Ru protective film of the obtained multilayer structure.

TABLE 9

(Heusler alloy: Co$_2$MnGe for the free layer alone)

| Construction of the multilayer film | | | Material | Thickness (Å) |
|---|---|---|---|---|
| Protective layer | | | Ru | 100 |
| Free layer | Heusler alloy layer | | Co$_2$MnGe | 50 |
| | Underlay magnetic layer | | FeCo | 10 |
| Nonmagnetic spacer layer | | | Cu | 20 |
| Fixed magnetization layer | Inner pin layer | Magnetic layer | FeCo | 50 |
| | | Underlay magnetic layer | CoFe | 10 |
| | Nonmagnetic intermediate layer | | Ru | 8 |
| | Outer pin layer | | FeCo | 30 |
| Antiferromagnetic layer | | | IrMn | 50 |
| Underlay layer | | | Ta/Ru | 10/20 |

It is here noted that the Heusler alloy layer referred to in Table 9 is found in the free layer alone: it is not found in the inner pin layer.

Samples comprising various Heusler alloy layers having varied layer states were prepared according to the way described set out in Table 10, given just below, while sputtering was implemented in varied modes and under varied conditions. The junction scale for each sample was 0.2 μm×0.2 μm, and each device was annealed at 290° C. for 3 hours.

After annealing, the samples were measured for their MR ratios by virtue of an ordinary 4-terminal method, as shown in Table 10, given just below. The MR ratio is a quotient obtained by dividing the amount of resistivity change ΔR by resistance value R, and given by ΔR/R. Usually, this value is given in terms of percent multiplied by 100. Note here that the MR ratio is worked out as an average of 100 device samples.

Whether or not there was a crack in the target at the time of forming the Heusler alloy layer by sputtering was also checked. Whether or not there was a crack in the target was judged from the inconsistency of sputtering discharge, and at the time when the crack seemed to appear, the sputtering operation was stopped for visual observation. The target with a crack is indicated as "found" in Table 10.

little crack in the target. The film-deposition rate can thus be brought up to an area at which good film quality is achievable, and there are productivity improvements as well.

Figure 10:
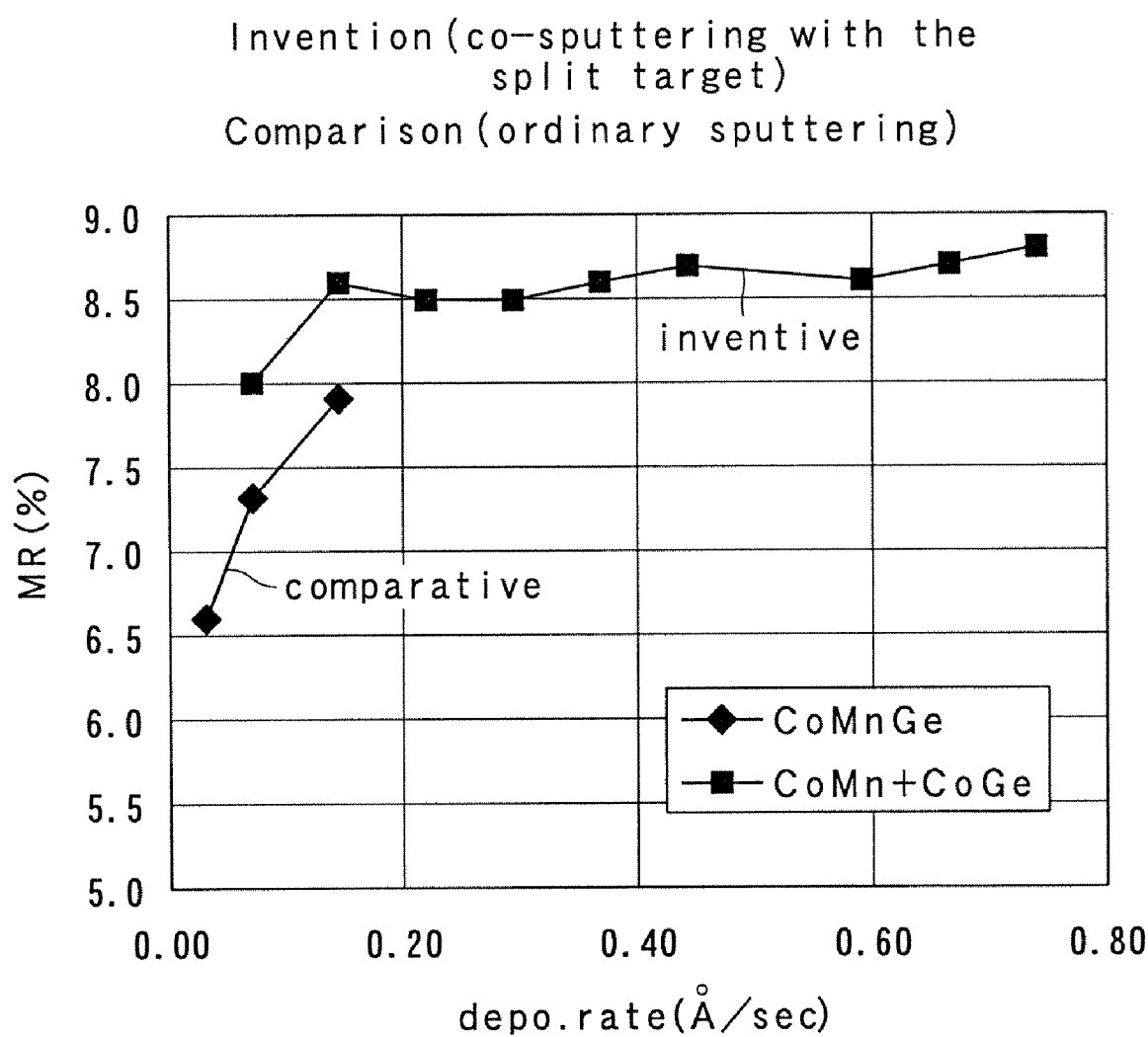
FIG. 10 is a graph indicative of film-deposition rate versus MR (%) relations on the basis of experimental data.

Further, sequential sputtering using the split target (Comparative Example 5-5) is more likely to render the MR performance worse than co-sputtering. For a better visual understanding of data, the data values of Table 10 (except those of Comparative Example 5-5) are graphically presented in FIG. 10.

From the aforesaid results, the effectiveness of the invention would be appreciated. That is, the present invention provides a fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, wherein said free layer functions such that a magnetization direction

TABLE 10

| Sample | Sputtering mode | Target material Target 1 | Target material Target 2 | Input Power Target 1 (W/cm$^2$) | Input Power Target 2 (W/cm$^2$) | Film-deposition rate (Å/sec) | MR (%) | Target crack |
|---|---|---|---|---|---|---|---|---|
| Ex. 5-1 | Co-sputtering | CoMn | CoGe | 0.2 | 0.3 | 0.07 | 8.0 | None |
| Ex. 5-2 | Co-sputtering | CoMn | CoGe | 0.4 | 0.6 | 0.15 | 8.8 | None |
| Ex. 5-3 | Co-sputtering | CoMn | CoGe | 0.6 | 0.8 | 0.22 | 9.0 | None |
| Ex. 5-4 | Co-sputtering | CoMn | CoGe | 0.8 | 1.1 | 0.30 | 9.0 | None |
| Ex. 5-5 | Co-sputtering | CoMn | CoGe | 1.0 | 1.4 | 0.37 | 9.2 | None |
| Ex. 5-6 | Co-sputtering | CoMn | CoGe | 1.2 | 1.7 | 0.44 | 9.1 | None |
| Ex. 5-7 | Co-sputtering | CoMn | CoGe | 1.6 | 2.2 | 0.58 | 9.2 | None |
| Ex. 5-8 | Co-sputtering | CoMn | CoGe | 1.8 | 2.5 | 0.66 | 9.3 | None |
| Ex. 5-9 | Co-sputtering | CoMn | CoGe | 2.0 | 2.8 | 0.74 | 9.1 | None |
| Ex. 5-10 | Co-sputtering | CoMn | CoGe | 2.3 | 3.3 | 0.89 | — | Found |
| Comp. Ex. 5-1* | Ordinary | Co$_2$MnGe | — | 0.2 | — | 0.04 | 6.6 | None |
| Comp. Ex. 5-2* | Ordinary | Co$_2$MnGe | — | 0.5 | — | 0.08 | 7.3 | None |
| Comp. Ex. 5-3* | Ordinary | Co$_2$MnGe | — | 0.9 | — | 0.15 | 7.9 | None |
| Comp. Ex. 5-4* | Ordinary | Co$_2$MnGe | — | 1.4 | — | 0.22 | — | Found |
| Comp. Ex. 5-5* | Sequential sputtering | CoMn | CoGe | 1.0 | 1.4 | 0.37 | 7.9 | None |

The results of Table 10 reveal that in Comparative Examples 5-1 to 5-4 each using a single target that is the same in composition as the Heusler alloy layer, there is a crack in the target occurring prematurely as the input power to the target increases, resulting in the inability to prepare a film at a high film-deposition rate at which good quality would seem to be obtainable.

With the co-sputtering using the split target according to the invention (inventive example), on the other hand, it is possible to increase the input power because there is no or changes depending on an external magnetic field, and is made up of a multilayer structure including a first Heusler alloy layer, and said fixed magnetization layer takes on a form wherein an inner pin layer and an outer pin layer are stacked one upon another with a nonmagnetic intermediate layer sandwiched between them, wherein said inner pin layer is made up of a multilayer structure including a second Heusler alloy layer, and said first and second Heusler alloy layers are each formed by a co-sputtering technique using a split target split into at least two sub-targets in such a way as to constitute a Heusler alloy layer composition. When the Heusler alloy layer is formed, therefore, it is possible to bring up a film-deposition rate, boost productivity, and improve the performance of the device.

Referring here to possible applications to the industry, the present invention could find use in the industry of hard disk systems comprising a magneto-resistive effect device adapted to read the magnetic field strength of a magnetic recording medium or the like in the form of signals.

What we claim is:

1. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a first Heusler alloy layer, said fixed magnetization layer takes on a form wherein an inner pin layer and an outer pin layer are stacked one upon another with a nonmagnetic intermediate layer sandwiched between them, and said inner pin layer is made up of a multilayer structure including a second Heusler alloy layer, the process comprising co-sputtering each of said first and second Heusler alloy layers using a split target, wherein said first and second Heusler alloy layers are each a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

2. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a first Heusler alloy layer, said fixed magnetization layer takes on a form wherein an inner pin layer and an outer pin layer are stacked one upon another with a nonmagnetic intermediate layer sandwiched between them, and said inner pin layer is made up of a multilayer structure including a second Heusler alloy layer, the process comprising co-sputtering each of said first and second Heusler alloy layers using a split target, wherein said first and second Heusler alloy layers are each a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of A and C and unavoidable impurities.

3. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a first Heusler alloy layer, said fixed magnetization layer takes on a form wherein an inner pin layer and an outer pin layer are stacked one upon another with a nonmagnetic intermediate layer sandwiched between them, and said inner pin layer is made up of a multilayer structure including a second Heusler alloy layer, the process comprising co-sputtering each of said first and second Heusler alloy layers using a split target, wherein said first and second Heusler alloy layers are each a Heusler alloy which has a general composition formula: ABC where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

4. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a Heusler alloy layer, the process comprising co-sputtering said Heusler alloy layer using a split target, wherein said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

5. The fabrication process for the magneto-resistive effect device of the CPP structure according to claim 4, wherein said general composition formula: $A_2BC$ is selected from the group consisting of $Co_2MnSi$, $Co_2MnGe$, and $Co_2FeSi$.

6. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a Heusler alloy layer, the process comprising co-sputtering said Heusler alloy layer using a split target, wherein said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of A and C and unavoidable impurities.

7. The fabrication process for the magneto-resistive effect device of the CPP structure according to claim 6, wherein said general composition formula: $A_2BC$ is selected from the group consisting of $Co_2MnSi$, $Co_2MnGe$, and $Co_2FeSi$.

8. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said free layer functions such that a magnetization direction changes depending on an external magnetic field, and is made up of a multilayer structure including a Heusler alloy layer, the process comprising co-sputtering said Heusler alloy layer using a split target, wherein said Heusler alloy layer is a Heusler alloy which has a general composition formula: ABC where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

9. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said fixed magnetization layer takes on a form wherein an inner pin layer and an outer pin layer are stacked one upon another with a nonmagnetic intermediate layer sandwiched between them, and said inner pin layer is made up of a multilayer structure including a Heusler alloy layer, the process comprising co-sputtering said Heusler alloy layer using a split target, wherein said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

10. The fabrication process for the magneto-resistive effect device of the CPP structure according to claim 9, wherein said general composition formula: $A_2BC$ is selected from the group consisting of $Co_2MnSi$, $Co_2MnGe$, and $Co_2FeSi$.

11. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said fixed magnetization layer takes on a form wherein an inner pin layer and an outer pin layer are stacked one upon another with a nonmagnetic intermediate layer sandwiched between them, and said inner pin layer is made up of a multilayer structure including a Heusler alloy layer, the process comprising co-sputtering said Heusler alloy layer using a split target, wherein said Heusler alloy layer is a Heusler alloy which has a general composition formula: $A_2BC$ where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of A and C and unavoidable impurities.

12. The fabrication process for the magneto-resistive effect device of the CPP structure according to claim 11, wherein said general composition formula: $A_2BC$ is selected from the group consisting of $Co_2MnSi$, $Co_2MnGe$, and $Co_2FeSi$.

13. A fabrication process for a magneto-resistive effect device having a CPP (current perpendicular to plane) structure comprising a nonmagnetic spacer layer, and a fixed magnetized layer and a free layer stacked one upon another with said nonmagnetic spacer layer sandwiched between them, with a sense current applied in a stacking direction, characterized in that:

said fixed magnetization layer takes on a form wherein an inner pin layer and an outer pin layer are stacked one upon another with a nonmagnetic intermediate layer sandwiched between them, and said inner pin layer is made up of a multilayer structure including a Heusler alloy layer, the process comprising co-sputtering said Heusler alloy layer using a split target, wherein said Heusler alloy layer is a Heusler alloy which has a general composition formula: ABC where A is at least one element selected from the group consisting of Co, Ni, Cu, Rh, Pt, Au, Pd, Ir, Ru, Ag, Zn and Cd; B is at least one element selected from the group consisting of Mn, V, Cr, Fe, Ti, Zr, Nb, Hf, Ta and Ni; and C is at least one element selected from the group consisting of Si, Ga, Ge, Al, Sn, In, Sb, Pb and Zn, and said split target is split into two sub-targets: a first sub-target consisting of A and B and unavoidable impurities, and a second sub-target consisting of C and unavoidable impurities.

14. The fabrication process for the magneto-resistive effect device of the CPP structure according to claim 1 or 2, wherein said general composition formula: $A_2BC$ is selected from the group consisting of $Co_2MnSi$, $Co_2MnGe$, and $Co_2FeSi$.

15. The fabrication process for the magneto-resistive effect device of the CPP structure according to claim 1, 2, 4, or 6, wherein a film-deposition rate for said co-sputtering is at least 0.2 Å/sec.

* * * * *